(12) United States Patent
Kim

(10) Patent No.: US 8,298,893 B2
(45) Date of Patent: Oct. 30, 2012

(54) METHOD FOR MANUFACTURING SEMICONDUCTOR DEVICE HAVING MULTI-LAYERED CONTACT

(75) Inventor: Jung Nam Kim, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/981,118

(22) Filed: Dec. 29, 2010

(65) Prior Publication Data

US 2012/0135592 A1  May 31, 2012

(30) Foreign Application Priority Data

Nov. 26, 2010  (KR) .................. 10-2010-0119204

(51) Int. Cl.
*H01L 21/336* (2006.01)
(52) U.S. Cl. ............................... 438/270; 257/E21.419
(58) Field of Classification Search .................. 438/270; 257/E21.419
See application file for complete search history.

(56) References Cited

U.S. PATENT DOCUMENTS

| 6,473,693 | B1* | 10/2002 | Kusama | 701/211 |
| 7,915,121 | B1* | 3/2011 | Kim | 438/259 |
| 7,928,504 | B2* | 4/2011 | Choi | 257/326 |
| 8,053,831 | B2* | 11/2011 | Yu | 257/330 |
| 2004/0245635 | A1* | 12/2004 | Lee et al. | 257/751 |
| 2005/0287759 | A1* | 12/2005 | Wang et al. | 438/400 |
| 2011/0121377 | A1* | 5/2011 | Jin | 257/301 |
| 2011/0133261 | A1* | 6/2011 | Kim | 257/296 |
| 2011/0151632 | A1* | 6/2011 | Cho | 438/239 |
| 2011/0309435 | A1* | 12/2011 | Hwang et al. | 257/330 |

FOREIGN PATENT DOCUMENTS

| KR | 1020100038586 A | 4/2010 |
| KR | 1020100111468 A | 10/2010 |

* cited by examiner

*Primary Examiner* — William D Coleman

(57) ABSTRACT

A method for manufacturing a semiconductor device is disclosed, which reduces a step difference between a peripheral region and a cell region. In the semiconductor device, a metal contact of the peripheral region is configured in a multi-layered structure. Prior to forming a bit line and a storage node contact in the cell region, a contact and a line are formed in the peripheral region, such that a step difference between the cell region and the peripheral region is reduced, resulting in a reduction in parasitic capacitance between lines.

15 Claims, 9 Drawing Sheets

METHOD FOR MANUFACTURING SEMICONDUCTOR DEVICE HAVING MULTI-LAYERED CONTACT

CROSS-REFERENCE TO RELATED APPLICATION

The priority of Korean patent application No. 10-2010-0119204 filed on Nov. 26, 2010, the disclosure of which is hereby incorporated in its entirety by reference, is claimed.

BACKGROUND OF THE INVENTION

Embodiments of the present invention relate to a method for manufacturing a highly-integrated semiconductor device, and more particularly to a method for manufacturing a semiconductor device to suppress parasitic capacitance between metal lines contained in a highly-integrated semiconductor device, such that the reliability of the semiconductor device is increased.

Generally, a semiconductor is a material that belongs to an intermediate region between a conductor and an insulator. Although the semiconductor is similar to an insulator in a pure state, electrical conductivity of the semiconductor device is increased by impurity implantation or other manipulation. The semiconductor is used to form a semiconductor device such as a transistor through impurity implantation and conductor connection. A device that has various functions simultaneously while being formed of a semiconductor element is referred to as a semiconductor device. A representative example of the semiconductor device is a semiconductor memory device. The semiconductor memory device includes a variety of constituent elements such as a transistor, a capacitor, etc. Such constituent elements are interconnected through a contact, so that electrical signals are communicated between the constituent elements. The semiconductor memory device has been rapidly developed to reduce power consumption as well as to rapidly read/write large amount of data.

As a design rule is reduced to 100 nm or less so as to increase the integration degree of the semiconductor memory device, a cross-sectional area occupied by constituent elements of the semiconductor memory device is reduced, resulting in various problems. For example, a channel length of the transistor is shortened so that a short channel effect such as a punch-through occurs. When forming a contact, an alignment error is increased so that contact resistance is also increased. As spacing between neighbor constituent elements is gradually reduced, it is difficult to electrically insulate among the constituent elements, and electrical interference caused by parasitic capacitance and the like is increased, so that operation stability and reliability of the semiconductor memory device are reduced.

In recent times, as the integration degree of the semiconductor device is increased, an active region is reduced in size. For example, in a fabrication process of 40 nm or less in an 8F$^2$ structure, a process for forming a device isolation region defining the active region is also becoming difficult. In addition, as the width of a gate pattern is gradually reduced, an aspect ratio of the gate pattern is increased, resulting in a defect such as an inclined part. In addition, from the viewpoint of a gate pattern, if the overlap degree is reduced because of an alignment error encountered between a recess region formed when a trench formed in an active region is buried and a pattern formed over the active region occurs, there arise various problems (for example, increase in resistance, reduction in fabrication margin for contact formation, etc.).

In addition, individual constituent elements of the semiconductor device are gradually reduced in size even in a core or peripheral region other than a cell region. It is necessary to form a contact and the like for interconnecting metal lines within a given space satisfying the design rule. In fact, as the space is gradually reduced in width, it is more difficult to form a pattern as well as to form a contact hole for forming a contact. In addition, the higher the integration degree, the smaller the spacing between neighboring lines. As a result, parasitic capacitance is unavoidably increased such that the reliability of the semiconductor device is reduced.

Meanwhile, constituent elements formed in a cell region, a core region, and a peripheral region are different in type, size, shape, and material from one another according to their use purposes. Therefore, constituent elements formed in the cell region and constituent elements formed in the core and peripheral region are not simultaneously performed, and are formed by different processes. Generally, when performing processes, such as a depositing process and an etching process, in the cell region, the cell region may be exposed using a mask that opens the cell region, and the core and peripheral region is covered with a photoresist film or the like. In contrast, when a pattern is formed in the core and peripheral region, damage to the cell region is prevented by using a mask covering the cell region. Since the pattern is formed by executing different processes in the cell region and the core and peripheral region, there arises a difference in height (i.e., a step difference) between a pattern of the cell region and a pattern of the core and peripheral region. Due to the step difference between the cell region and the core and peripheral region, it may be difficult to form a wiring for coupling constituent elements contained in the cell region to constituent elements contained in the core and peripheral region. For example, a bit line for coupling a unit cell contained in the cell region to a sense amplifier (sense-amp) formed in the core region will hereinafter be described. Under a current design rule, a size of a bit line coupled to a unit cell and a space between neighboring bit lines are very small. Therefore, provided that a step difference between the cell region and the core region is high, there is a high probability that a bit line is severed due to the high step difference.

As described above, according to the method for manufacturing conventional semiconductor devices, under a current design rule, the parasitic capacitance between metal lines is increased and the fabrication tolerances are unavoidably reduced because it is difficult to form a metal line due to a difference in height (i.e., a step difference) between the cell region and the core and peripheral region. Specifically, the increase in parasitic capacitance of a bit line for coupling a cell transistor to a sense amplifier (sense-amp) and the reduction in fabrication tolerances may have a negative influence upon the operation characteristics of the sense amplifier.

BRIEF SUMMARY OF THE INVENTION

Various embodiments of the present invention are directed to providing a method for manufacturing a semiconductor device that substantially obviates one or more problems due to limitations and disadvantages of the related art.

An embodiment of the present invention relates to a method for manufacturing a semiconductor device in which a metal line coupled to a transistor constructing a sense amplifier (sense-amp) is formed of two layers, so that a step difference between the metal line and the bit line of the cell region can be reduced and parasitic capacitance encountered between neighbor bit lines can be suppressed.

In accordance with an aspect of the present invention, a method for manufacturing a semiconductor device includes forming a buried gate in a cell region on a substrate, forming a gate pattern including a planar channel in a core and peripheral region, forming a multi-layered contact and a multi-layered line in the core and peripheral region, the multi-layered contact including a first contact and a second contact provided over the first contact, the multi-layered line including a first line and a second line, the first line provided between the first and the second contacts, and coupling the first line formed over the first contact that has substantially the same height as that of the gate pattern to a bit line of the cell region.

The forming of the multi-layered contact and the multi-layered line in the core and peripheral region may include forming the first contact that has substantially the same height as the gate pattern, forming the first line over the first contact, forming the second contact over the first line, and forming the second line over the second contact.

The method may further include forming the bit line and a storage node contact in the cell region between the steps of forming the second contact and forming the first contact.

The method for manufacturing the semiconductor device may further include forming a storage node over the storage node contact.

The forming the first contact may include forming contact holes each exposing a gate electrode of the gate pattern and an active region of first and second sides of the gate pattern, forming a metal barrier film over an inner surface of the contact hole, forming a conductive film over the metal barrier film in such a manner that the contact hole is filled, and performing a planarization process in such a manner that the metal barrier film and the conductive film are buried in an insulation film.

The metal barrier film may include titanium (Ti) or titanium nitride (TiN). The conductive film may include tungsten (W) or aluminum (Al). The buried gate may construct a word line, and the gate pattern may construct a sense amplifier (sense-amp). In this case, the bit line and the first line may have the same metal material, and are protected by a metal barrier film.

In accordance with another aspect of the present invention, a method for manufacturing a semiconductor device includes forming a buried gate in a cell region, forming a gate pattern including a planar channel in a core and peripheral region, forming a lower contact in the core and peripheral region, forming a bit line and a storage node contact in the cell region, forming an upper contact over the lower contact, and forming a storage node over the storage node contact.

The forming of the lower contact includes forming a contact hole that exposes a gate electrode of the gate pattern and an active region of a first side and a second side of the gate pattern, forming a metal barrier film over an inner surface of the contact hole, forming a conductive film over the metal barrier film in such a manner that the contact hole is buried, and depositing an insulation film over the metal barrier film and the conductive film.

The method for manufacturing the semiconductor device may further include forming a first line between the lower contact and the upper contact.

In accordance with another aspect of the present invention, a method for manufacturing a semiconductor device includes forming a cell gate in a cell region of a substrate, forming a peri gate in a peripheral region of the substrate, forming a first insulating layer over the cell gate and the peri gate, the first insulating layer being substantially planar and patterning the first insulating layer to form a bit line in the cell region and a lower metal wire pattern in the peripheral region, wherein the bit line is coupled to the substrate at a first side of the cell gate, and the lower metal wire pattern is coupled to the peri gate, the substrate at a first side of the peri gate, or the substrate at a second side of the peri gate.

The bit line in the cell region is coupled to the lower metal wire pattern and may include a conductive pattern and a hard mask pattern formed over the conductive pattern. The lower metal wire pattern includes a lower metal contact pattern and a lower metal line formed over the lower metal contact pattern, and wherein the bit line in the cell region is coupled to the lower metal line.

The method for manufacturing the semiconductor device may further include forming a second insulating layer over the cell region and the peripheral region, the second insulating layer being substantially planar, and patterning the second insulation layer to form an upper metal contact pattern in the peripheral region, wherein the upper metal contact pattern is coupled to the lower metal contact pattern.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Embodiments of the present invention relate to a technology for increasing the reliability of a semiconductor device. In particular, the embodiments of the present invention relate to a method for manufacturing a semiconductor device, which can minimize a step difference between the cell region and the core and peripheral region (hereinafter referred to as 'peripheral region') when forming a metal line for coupling constituent elements of the cell region to those of the peripheral region.

A method for manufacturing a semiconductor device according to the embodiments of the present invention will hereinafter be described with reference to the drawings.

FIGS. 1A to 1D are cross-sectional views illustrating a method for manufacturing a semiconductor device according to one embodiment of the present invention.

Figure 1A:
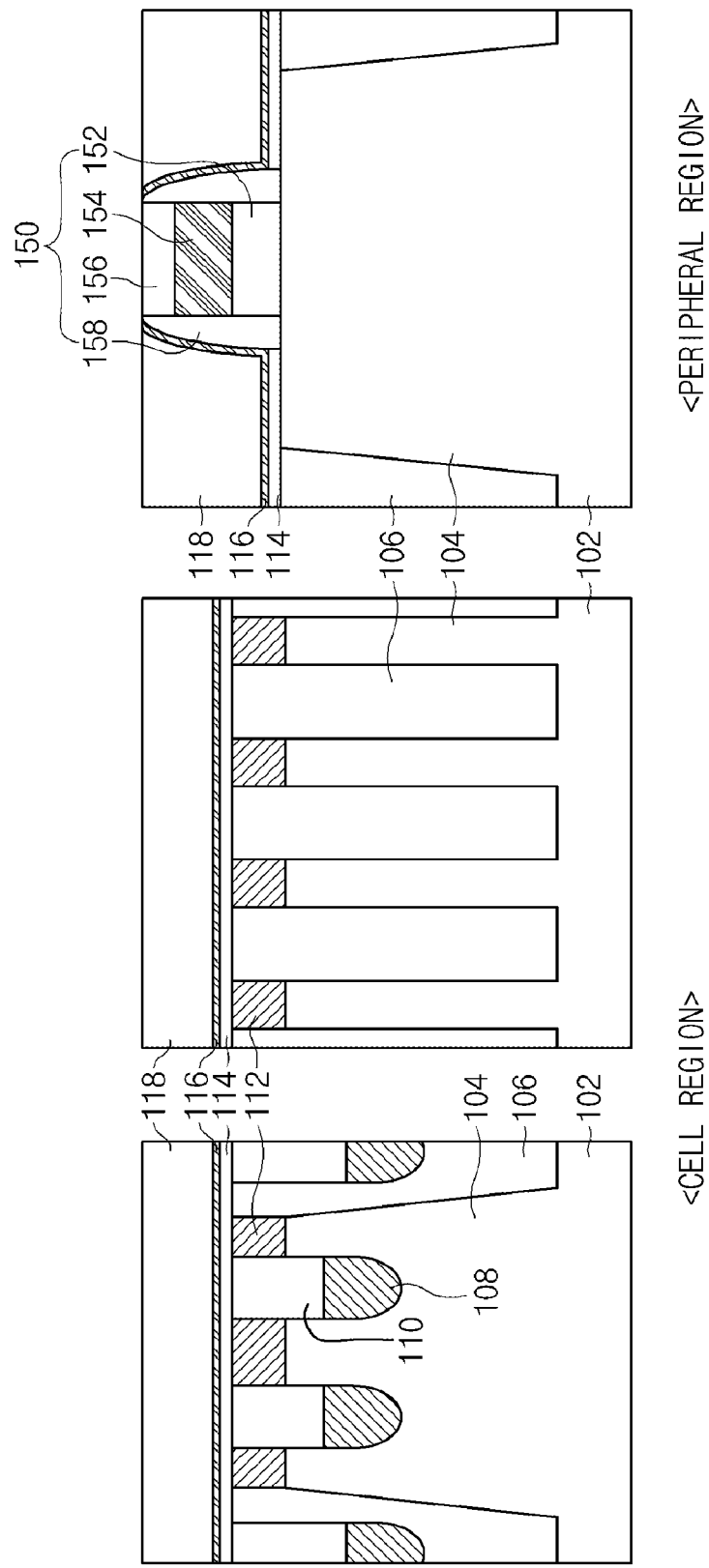
FIGS. 1A to 1D are cross-sectional views illustrating a method for manufacturing a semiconductor device according to one embodiment of the present invention.

Referring to FIG. 1A, a device isolation region 106 defining an active region 104 in a semiconductor substrate 102 which includes a cell region and a peripheral region is formed through a Shallow Trench Isolation (STI) process. In this case, the cell region is a space in which several unit cells are formed, and the peripheral region is a space in which a sense amplifier is formed. The formation of the device isolation region 106 through the STI process is well known to those skilled in the art, and as such a detailed description thereof will be omitted herein.

The active region 104 and the device isolation region 106 are etched through an etch process that uses a mask defining a gate region, such that a recess is formed. Next, a conductive material fills in the recess, and is then etched back, so that a buried gate 108 is formed at a lower part of the recess. In this case, a conductive material for forming a gate may be a titanium-based (e.g., TiN) metal or a tungsten-based (e.g., W) metal. An insulation film 110 is formed over the buried gate 108. A conductive material 112 for forming a contact is deposited over the active region 104 at both sides of the buried gate 108.

On the other hand, a gate pattern 150 is formed over the active region 104 in the peripheral region. The gate pattern 150 includes a lower gate electrode 152; an upper gate electrode 154 formed over the lower gate electrode 152; a gate hard mask film 156 formed over the upper gate electrode 154; and a spacer 158 formed at sidewalls of the lower gate electrode 152; the upper gate electrode 154; and the gate hard mask film 156. The conductive layer 112 and the lower gate electrode 152 contained in the gate pattern 150 may be formed of the same material.

Then, an insulation film 114, an etching prevention film 116, and an insulation film 118 are sequentially deposited over the cell region and the peripheral region, and are then planarized in such a manner that the gate pattern 150 is exposed.

Figure 1B:
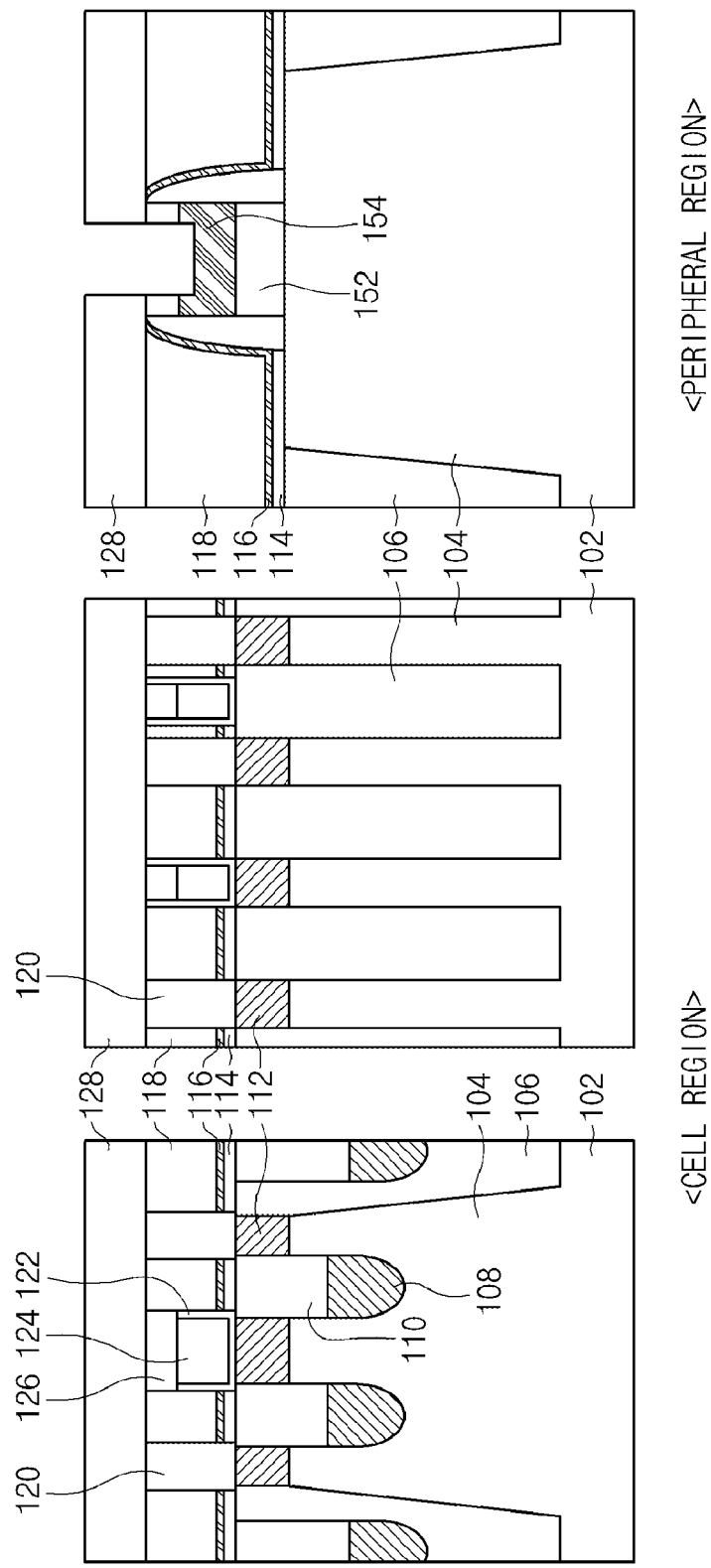

Referring to FIG. 1B, a contact hole is formed in such a manner that a conductive layer 112 formed at a first side of the buried gate 108 is exposed in the active region of the cell region, and a conductive material is buried in the contact hole, so that a storage node contact 120 is formed. In addition, the contact hole is formed in such a manner that the conductive layer 112 at a second side of the buried gate 108 is exposed in the active region of the cell region. After that, the metal barrier film 122 is deposited over an inner surface of a lower part of the contact hole, and a bit line 124 is formed such that the inner side of the metal barrier film 122 is filled with the bit line 124. In this case, the metal barrier film 122 may be formed of a titanium (Ti) or titanium nitride (TiN) film.

Then, after the bit line hard mask layer 126 is formed over the bit line 124, the insulation film 128 is formed over the cell region and the peripheral region.

After that, contact holes are formed using a mask that defines the contact region in the peripheral region, such that the upper gate electrode 154 of the gate pattern 150 and the active region formed at both sides of the gate pattern 150 are exposed, respectively.

Figure 1C:
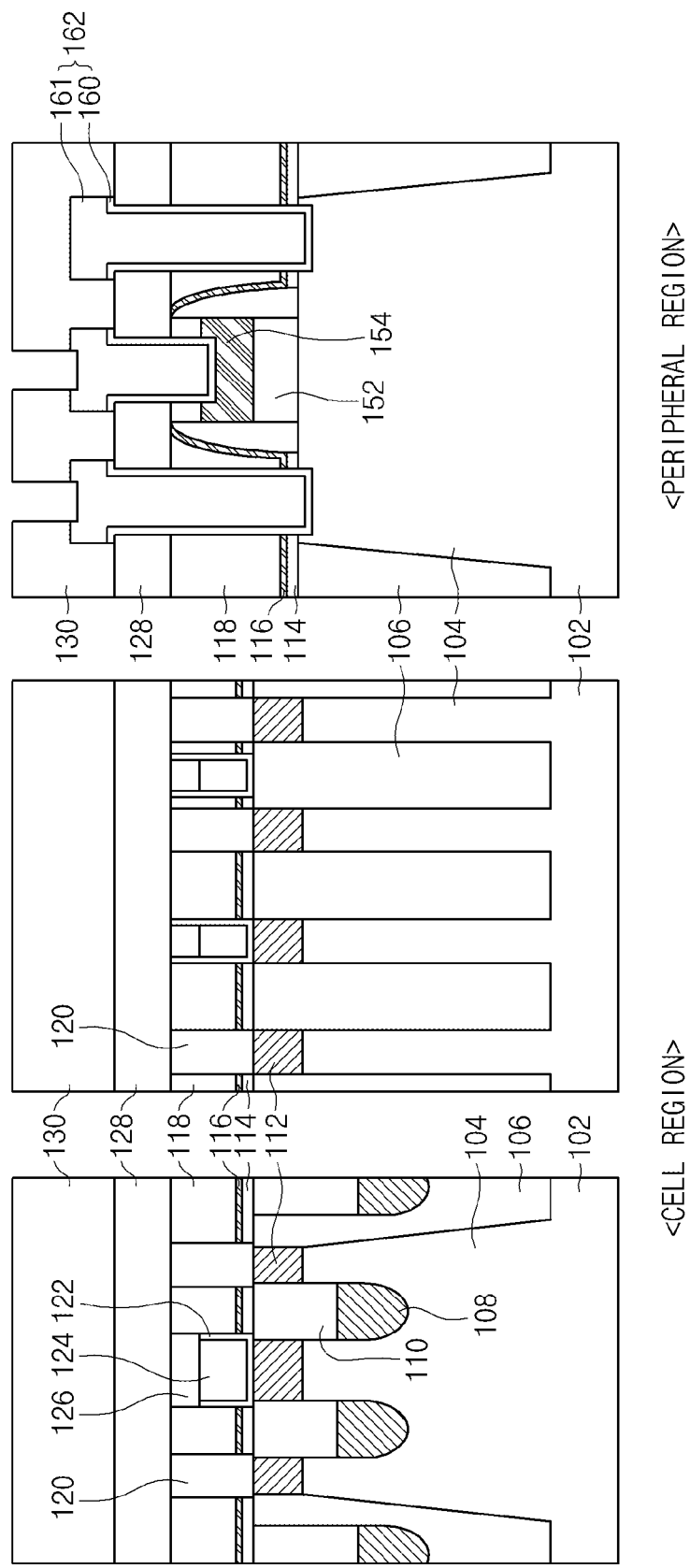

Referring to FIG. 1C, a metal barrier film 160 is deposited over the entire surfaces of the cell region and the peripheral region, and a conductive film 161 including tungsten (W), aluminum (Al) and the like is then deposited over the resultant metal barrier film 160. Subsequently, the metal barrier film 160 and the conductive film 161 are patterned such that a lower metal contact 162 is formed in the peripheral region.

Thereafter, after the insulation film 130 is formed in the cell region and the peripheral region, the insulation film 130 is etched using a mask that defines an upper metal contact region, such that a contact hole that exposes the conductive film 161 of the lower metal contact 162 is formed.

Figure 1D:
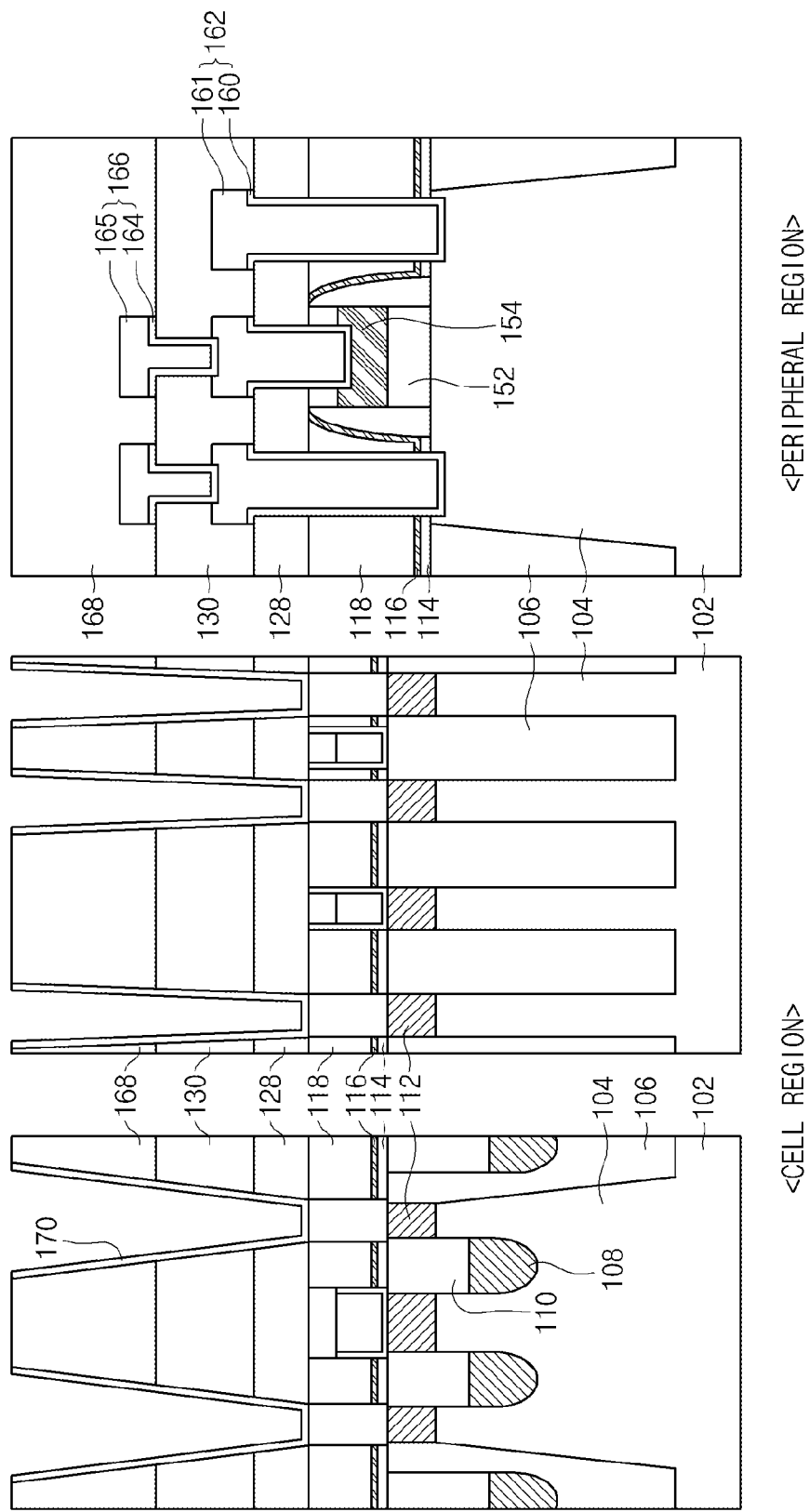

Referring to FIG. 1D, a metal barrier film 164 is deposited over the entire surface of the semiconductor substrate, a conductive film 165 is deposited over the resultant metal barrier film 164 and then, the metal barrier film 164 and the conductive film 165 are patterned to form an upper metal contact 166 in the peripheral region.

After forming the insulation film 168 in the cell region and the peripheral region, the insulation film 168 is etched in such a manner that the storage node contact 120 is exposed using a mask that defines a storage node region of a capacitor, thereby forming a contact hole (not shown).

Thereafter, a storage node 170 of the capacitor is formed along an inner surface of a contact hole. For example, a storage node material (e.g., TiN) is deposited along a step difference at an upper part of the insulation film 168 including the contact hole, and is then planarized in such a manner that the storage node 170 is formed only on the inner surface of the contact hole.

Then, the insulation film 168 between the storage nodes 170 is removed, a dielectric film (not shown) is deposited over the storage nodes 170, and a plate electrode (not shown) of a capacitor is formed over the dielectric film such that the contact hole is buried.

According to the above-mentioned embodiment, a gate pattern 150 has been formed in the peripheral region, a storage node contact 120 and a bit line 124 have been formed in the cell region, and the metal contacts 162 and 166 are finally formed in the peripheral region.

However, in accordance with the semiconductor device, after a gate pattern is formed in the peripheral region, a metal contact is first formed in the peripheral before the storage node contact and the bit line are formed in the cell region, such that a step difference can be further reduced.

FIGS. 2A to 2E are cross-sectional views illustrating a method for manufacturing a semiconductor device according to another embodiment of the present invention.

Figure 2A:
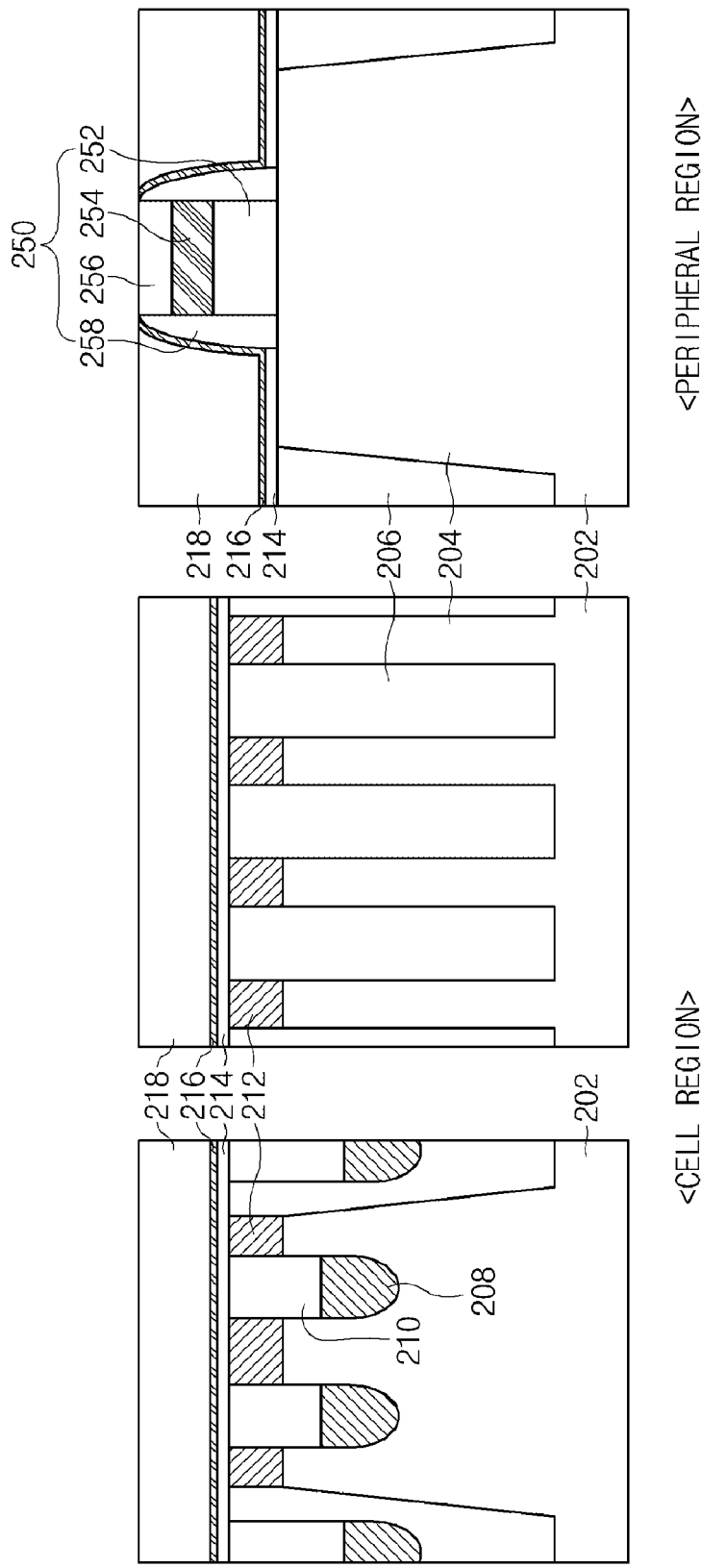
FIGS. 2A to 2E are cross-sectional views illustrating a method for manufacturing a semiconductor device according to another embodiment of the present invention. In each figure, the first cell region figure shows a cross-sectional view of a cell region taken along a long-axis of an active region in the cell region, and the second cell region figure shows a cross-sectional view of the cell region taken along a short-axis of an active region in the cell region. The long-axis and the short-axis are perpendicular to each other.

Referring to FIG. 2A, a device isolation region 206 for defining an active region 204 is formed over a semiconductor substrate 202 of the cell region and the peripheral region through the STI process.

Subsequently, the active region 204 and the device isolation region 206 contained in the cell region are etched using a mask defining a gate region, such that a recess is formed. After that, a conductive layer is deposited to bury a recess and is then etched back, so that a buried gate 208 is formed at a lower part of the recess. An insulation film 210 is formed over the buried gate 208. A conductive material 212 for forming a contact is deposited over the active region 204 formed at both sides of the buried gate 208.

On the other hand, the gate pattern 250 is formed over the active region 204 in the peripheral region. The gate pattern 250 includes a lower gate electrode 252; an upper gate electrode 254 formed over the lower gate electrode 252; a gate hard mask film 256 formed over the upper gate electrode 254; and a spacer 258 formed at sidewalls of the lower gate electrode 252; the upper gate electrode 254; and the gate hard mask film 256.

Then, an insulation film 214, an etching prevention film 216, and an insulation film 218 are sequentially deposited over the cell region and the peripheral region, and are then planarized in such a manner that the gate pattern 250 is exposed.

Figure 2B:
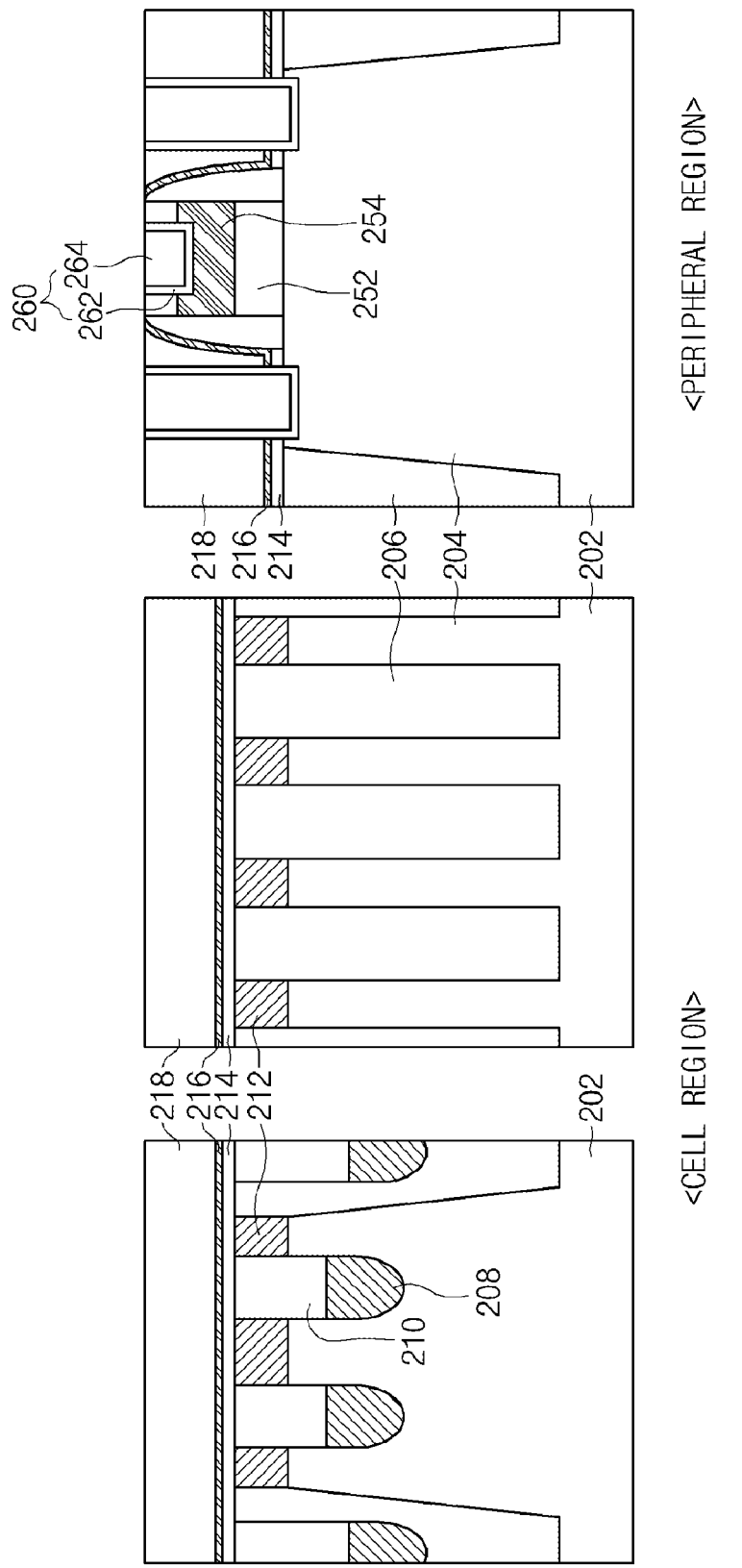

Referring to FIG. 2B, a contact hole is formed in the peripheral region using a mask defining a contact region in such a manner that the upper gate electrode 254 of the gate pattern 250 and the active regions located at both sides of the gate pattern 250 are exposed.

Subsequently, a metal barrier film 262 is deposited over the entire surfaces of the cell region and the peripheral region, and a conductive film 264 including tungsten (W), aluminum (Al), etc. is deposited over the resultant metal barrier film 262. The conductive film 264 and the metal barrier film 262 are CMP-planarized in such a manner that the insulation film 218 is exposed, so that a lower metal contact 260 can be formed.

As described above, according to this embodiment of the present invention, the lower metal contact 260 is formed in the peripheral region before a storage node contact and a bit line are formed in the cell region. When forming the lower metal contact 260, the storage node contact and the bit line are not yet formed in the cell region such that there is no possibility that the storage node contact is exposed in the planarization process. As a result, the CMP process can be used for the planarization process. Portions of the metal barrier film 262 and the conductive film 264 that protrude from the insulation film 218 are removed through the CMP process to reduce the height of the lower metal contact 260, resulting in a reduction in a step difference between the cell region and the peripheral region. In addition, the lower metal contact 264 is formed only in the contact hole, to increase electrical isolation between neighboring contacts and reduce parasitic capacitance.

Figure 2C:
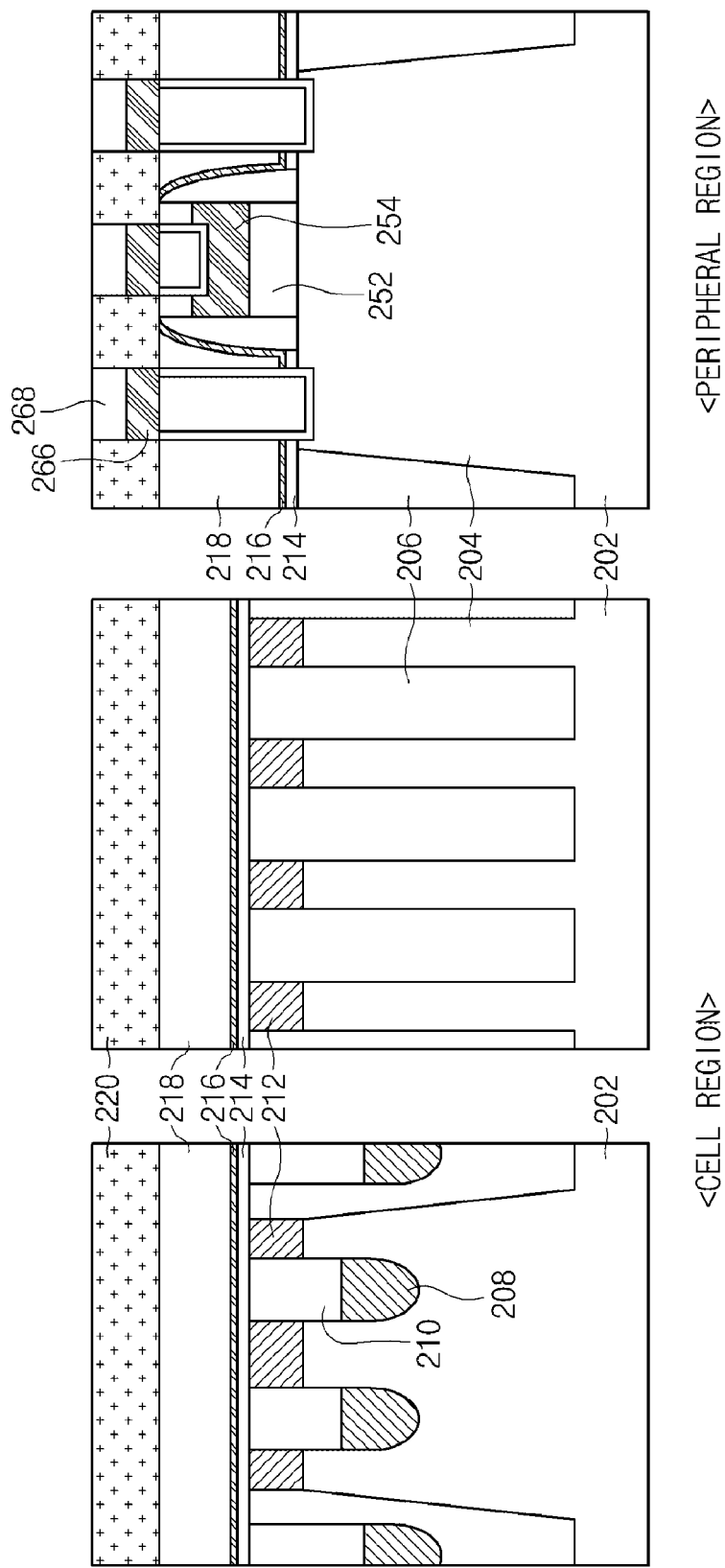

Referring to FIG. 2C, an insulation film 220 is deposited over the cell and peripheral regions. Thereafter, the insulation film 220 is etched to expose the lower metal contact 260 using a mask that defines a region in which a metal line is to be formed in the peripheral region, such that a trench (not shown) is formed.

After forming a metal line 266 by depositing a metal such as tungsten (W) in the trench, a line hard mask film 268 is formed over the metal line 266 so that it is electrically isolated from neighboring elements. Then, the planarization process is performed to expose the insulation film 220, so that a step difference between the cell region and the peripheral region is removed.

Figure 2D:
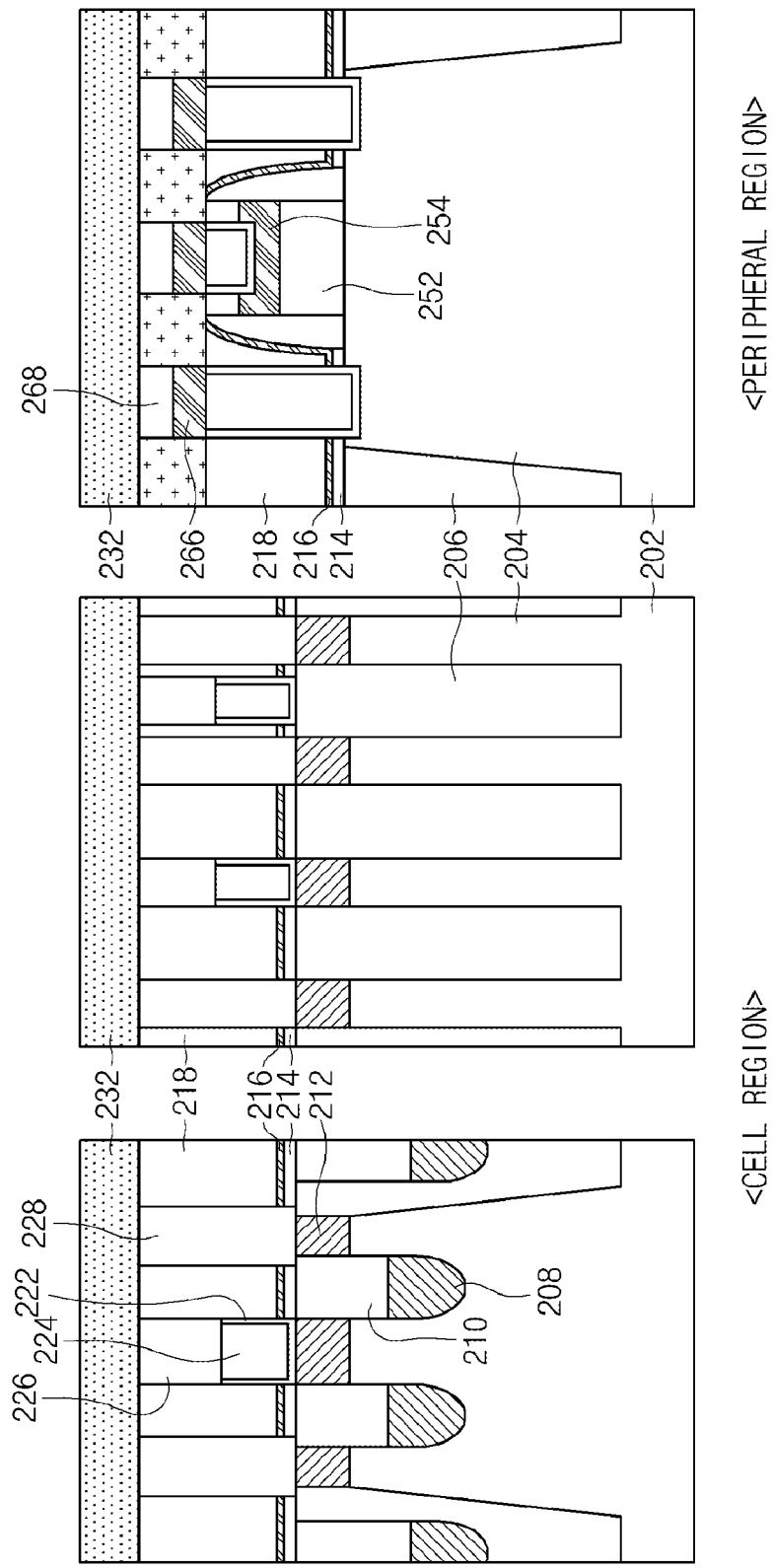

Referring to FIG. 2D, a bit line 224 and a storage node contact 228 are formed in the cell region. To accomplish this, a contact hole is formed to expose a conductive layer 212 located at a first side of the buried gate 208 in the active region of the cell region, and a conductive material is then deposited in the contact hole, so that the storage node contact 228 is formed. Thereafter, a contact hole is formed to expose the conductive layer 212 formed at a second side of the buried gates 208, a metal barrier film 222 is deposited over an inner surface of a lower part of the contact hole, and a bit line 224 is formed in the metal barrier film 222. In this case, the metal barrier film 222 may be formed of Ti or TiN.

Subsequently, a bit line hard mask layer 226 is formed over the bit line 224, so that it is electrically isolated from neighboring elements. Then, a planarization process is performed to expose the insulation film 218, so that a step difference between the cell region and the peripheral region is removed. Subsequently, an insulation film 232 is formed over the cell region and the peripheral region.

Figure 2E:
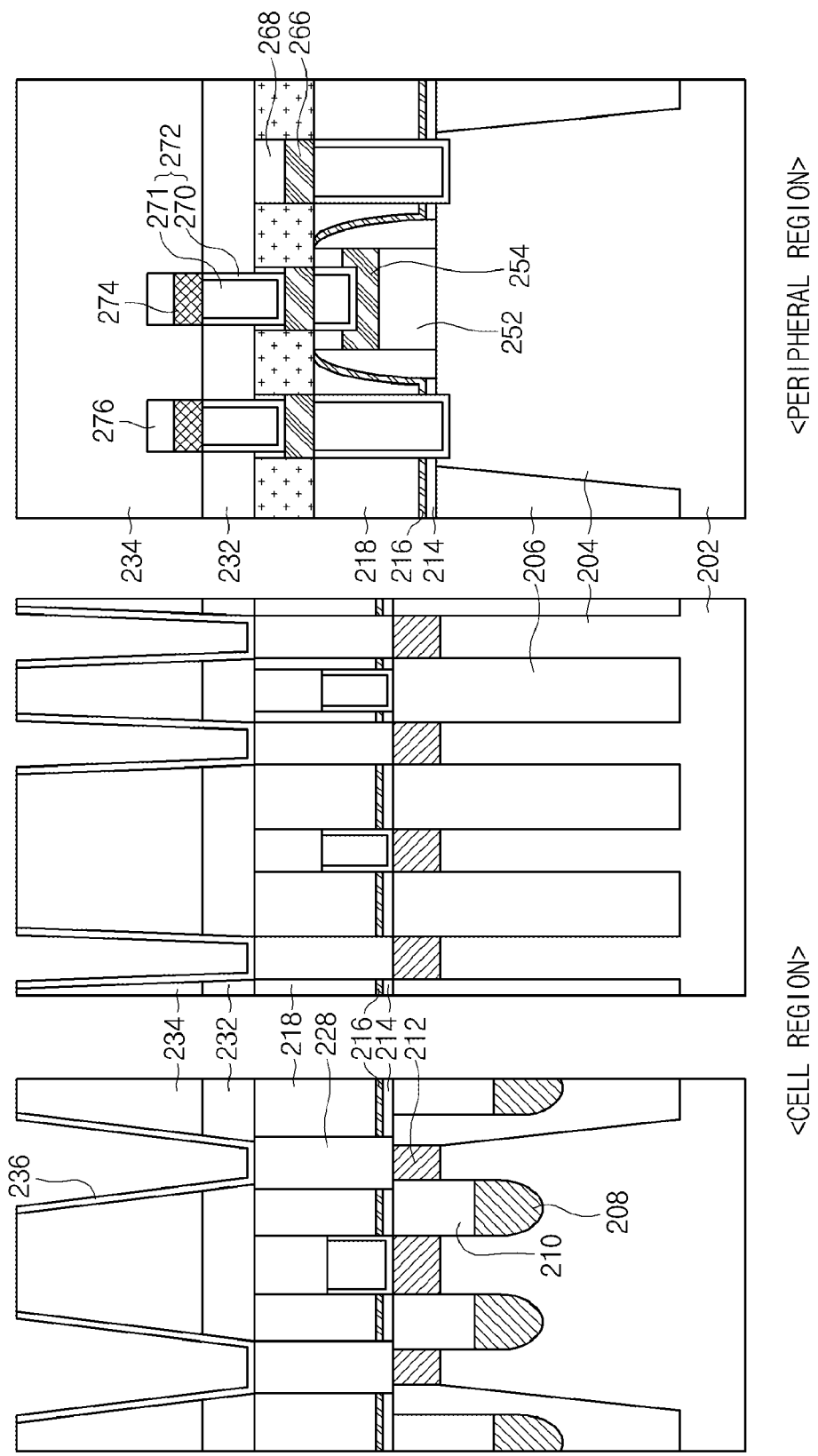

Referring to FIG. 2E, the insulation film 232 and the line hard mask film 268 in the peripheral region are etched using a mask defining an upper metal contact region, so that a contact hole is formed to expose the metal line 266.

Then, in a process similar to the process illustrated by FIG. 2B, the metal barrier film 270 is deposited over the entire surface of the semiconductor substrate, a conductive film 271 is deposited over the metal barrier film 270, and the conductive film 271 and the metal barrier film 270 are CMP-planarized to expose the insulation film 232, so that the upper metal contact 272 is formed.

Subsequently, in a process similar to the process illustrated by FIG. 2C, a metal line 274 and a line hard mask film 276 are formed over the upper metal contact 272, and an insulation film 234 is formed in the cell region and the peripheral region. In this case, prior to forming the insulation film 234, an insulation film 232 formed in the cell region may be removed using a mask that opens the cell region.

The insulation film 234 is etched to expose a storage node contact 228 using a mask defining a storage node region of a capacitor, so that a contact hole (not shown) is formed. Subsequently, a storage node 236 of the capacitor is formed along an inner surface of the contact hole.

Subsequently, the insulation film 234 formed between the storage nodes 236 is removed, a dielectric film (not shown) is deposited over the storage nodes 236, and a plate electrode (not shown) of the capacitor is formed over the dielectric film in such a manner that the contact hole is buried.

In some embodiments of the present invention, the bit line 224 of the cell region may be selectively coupled to the metal line 266 formed in the peripheral region. In this case, a step difference between the bit line 224 and the metal line 266 can be minimized.

As is apparent from the above description, a method for manufacturing a semiconductor device according to the present invention forms a double-layered metal line coupled to a sense amplifier (sense-amp), so that a step difference between the cell region and the peripheral region can be minimized. Since a step difference between the cell region and the peripheral region is reduced, a metal line can be easily formed in a semiconductor device.

In addition, a metal line coupled to the sense amplifier (sense-amp) comprises two layers, and the metal barrier film is formed only at a metal line area, so that parasitic capacitance between neighbor metal lines can be suppressed. In addition, parasitic capacitance between the metal lines is suppressed, resulting in increased reliability of the semiconductor device.

It will be apparent to those skilled in the art that various modifications and variations can be made to these embodiments without departing from the spirit or scope of the invention. Thus, it is intended that the present invention covers the modifications and variations provided they come within the scope of the appended claims and their equivalents.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a semiconductor device comprising:
 forming a buried gate in a cell region on a substrate;
 forming a gate pattern including a planar channel in a core and peripheral region;
 forming a multi-layered contact and a multi-layered line in the core and peripheral region, the multi-layered contact including a first contact and a second contact provided over the first contact, the multi-layered line including a first line and a second line, the first line provided between the first and the second contacts; and coupling the first line formed over the first contact that has substantially the same height as that of the gate pattern to a bit line of the cell region.

2. The method according to claim 1, wherein the forming the multi-layered contact and the multi-layered line includes:
   forming the first contact that has substantially the same height as the gate pattern;
   forming the first line over the first contact;
   forming the second contact over the first line; and
   forming the second line over the second contact.

3. The method according to claim 1, wherein the gate pattern constructs a sense amplifier (sense-amp).

4. The method according to claim 1, wherein a metal barrier film is formed over sidewalls and bottom surfaces of the bit line and the first line.

5. The method according to claim 2, further comprising:
   forming the bit line and a storage node contact in the cell region between the steps of forming the second contact and forming the first contact.

6. The method according to claim 2, wherein the forming the lower contact includes:
   forming contact holes each exposing a gate electrode of the gate pattern and an active region of first and second sides of the gate pattern;
   forming a metal barrier film over an inner surface of the contact hole;
   forming a conductive film over the metal barrier film in such a manner that the contact hole is filled; and
   performing a planarization process in such a manner that the metal barrier film and the conductive film are buried in an insulation film.

7. The method according to claim 5, further comprising:
   forming a storage node over the storage node contact.

8. The method according to claim 6, wherein the metal barrier film includes titanium (Ti) or titanium nitride (TiN), and the conductive film includes tungsten (W) or aluminum (Al).

9. A method for manufacturing a semiconductor device comprising:
   forming a buried gate in a cell region;
   forming a gate pattern including a planar channel in a core and peripheral region;
   forming a lower contact in the core and peripheral region;
   forming a bit line and a storage node contact in the cell region;
   forming an upper contact over the lower contact; and
   forming a storage node over the storage node contact.

10. The method according to claim 9, wherein the forming of the lower contact includes:
    forming a contact hole that exposes a gate electrode of the gate pattern and an active region of a first side and a second side of the gate pattern;
    forming a metal barrier film over an inner surface of the contact hole;
    forming a conductive film over the metal barrier film in such a manner that the contact hole is buried; and
    depositing an insulation film over the metal barrier film and the conductive film.

11. The method according to claim 9, further comprising:
    forming a first line between the lower contact and the upper contact.

12. A method for manufacturing a semiconductor device comprising:
    forming a cell gate in a cell region of a substrate;
    forming a peri gate in a peripheral region of the substrate;
    forming a first insulating layer over the cell gate and the peri gate, the first insulating layer being substantially planar; and
    patterning the first insulating layer to form a bit line in the cell region and a lower metal wire pattern in the peripheral region, wherein the bit line is coupled to the substrate at a first side of the cell gate, and the lower metal wire pattern is coupled to the peri gate, the substrate at a first side of the peri gate, or the substrate at a second side of the peri gate,
    wherein the bit line includes a conductive pattern and a hard mask pattern formed over the conductive pattern.

13. The method of claim 12, wherein the bit line in the cell region is coupled to the lower metal wire pattern.

14. The method of claim 12, wherein the lower metal wire pattern includes a lower metal contact pattern and a lower metal line formed over the lower metal contact pattern, and wherein the bit line in the cell region is coupled to the lower metal line.

15. The method of claim 12, the method further comprising:
    forming a second insulating layer over the cell region and the peripheral region, the second insulating layer being substantially planar; and
    patterning the second insulation layer to form an upper metal contact pattern in the peripheral region, wherein the upper metal contact pattern is coupled to the lower metal contact pattern.

* * * * *